March 23, 1965
M. H. OXMAN
3,175,050
BI-DIRECTIONAL SIGNAL CIRCUIT
Filed March 21, 1960
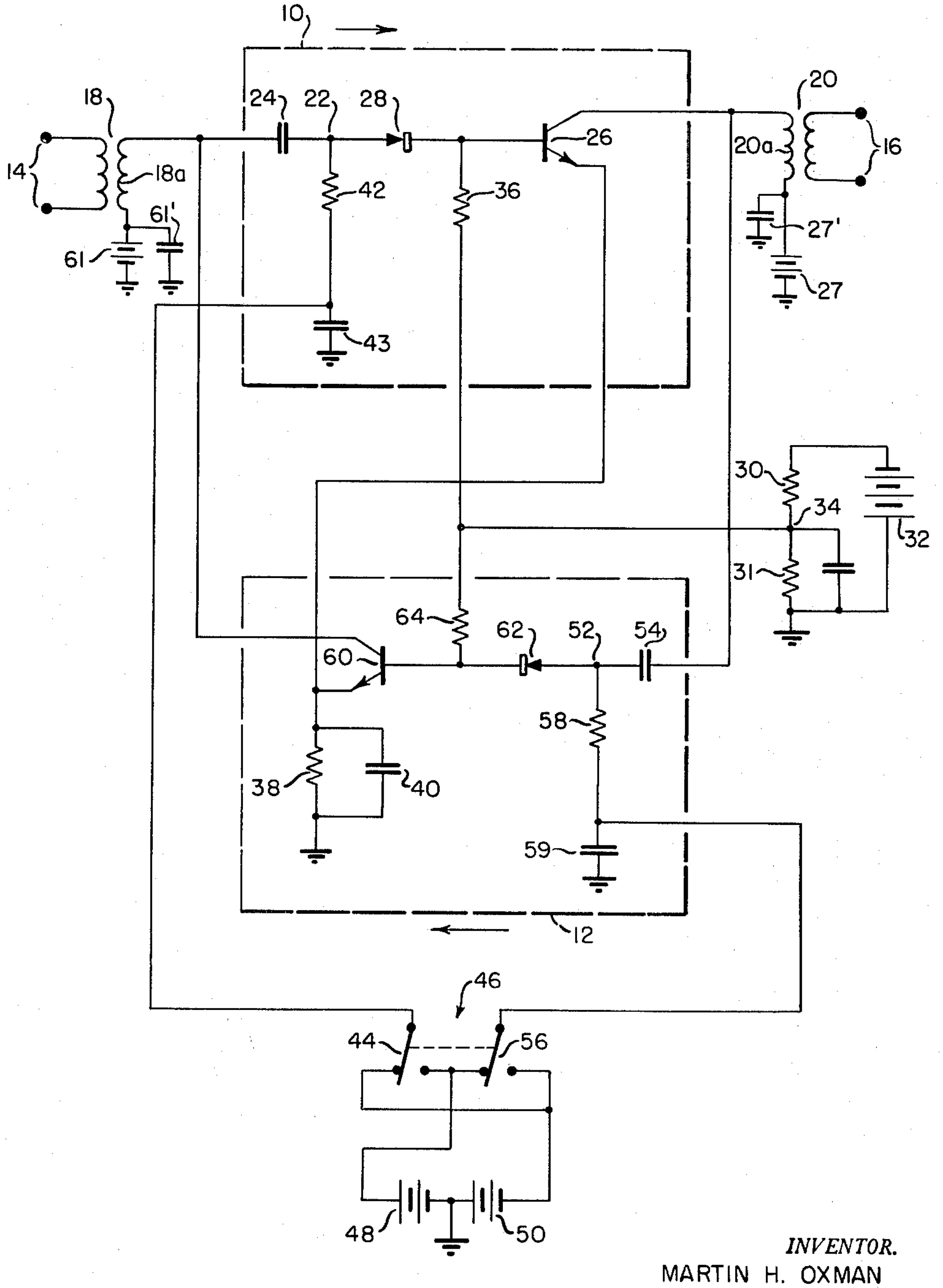
INVENTOR.
MARTIN H. OXMAN
BY Kenway, Jenney, Witter + Hildreth
ATTORNEYS

United States Patent Office 3,175,050
Patented Mar. 23, 1965

3,175,050

BI-DIRECTIONAL SIGNAL CIRCUIT

Martin H. Oxman, Malden, Mass., assignor to National Company, Inc., Malden, Mass., a corporation of Massachusetts Filed Mar. 21, 1960, Ser. No. 16,395
7 Claims. (Cl. 179—170)

My invention relates in general to a new and improved bi-directional signal circuit and in particular to a circuit which permits signal transmission between two pairs of terminals in one of two arbitrarily selected directions.

Bi-directional signal circuits are useful in many applications, e.g., in transceivers where the same passive components may be used for signal transmitting and receiving purposes to achieve a material reduction in the cost and bulk of the equipment. The passive components which can do double duty are generally bilateral devices, i.e., they are capable of transmitting signals in either direction. As a rule, these passive components are combined with, or form part of, amplifier stages which are unilaterally conductive. Accordingly, a modification of the existing circuitry is required in order to employ these components in a dual capacity.

The obvious method for reversing the direction of signal flow in a multi-stage amplifier is to switch over the input and output terminals mechanically. Alternatively input and output terminals of individual stages maybe switched. In order to carry out switching of individual stages, a switch wafer must be associated with each stage that is to be switched. While such a solution may be satisfactory at relatively low frequencies and in equipment where no particular requirement to conserve space exists, it seriously complicates the construction of a transceiver which is to operate at radio frequencies and where space is at a premium. Additionally, it serves to lessen the reliability of the equipment due to the increased chance of mechanical failure.

The use of two-way amplifiers, which are well known, also fails to provide a satisfactory solution under the given operating conditions. In a two-way amplifer circuit signal transmission in either direction is permitted at all times. Not only does such equipment require the use of hybrid transformers which may be impractical at the frequencies involved, but it also fails to provide the desired operation, i.e., signal transmission at will in the chosen direction. Moreover, cross-talk and feedback are frequently unavoidable in equipment of this type.

In an alternative arrangement which is sometimes employed, two amplifiers each of which transmits in a direction opposite to the other are provided at each point where a reversal of the direction of signal transmission takes place. Here, the control over the direction of signal flow is exercised by selectively switching the supply voltages of the amplifiers on or off. In miniaturized equipment where transistors are used extensively, such a circuit rarely insures against the occurrence of signal intermodulation and distortion. Where transistor amplifiers are used, these effects may occur as a result of signal leakage across the emitter-collector junction of the transistor which is nominally cut off. These effects may also be caused by the appearance of an excessively large voltage swing on the collector of the conductive transistor. If this voltage swing is applied to the input of the reverse-biased (cut-off) transistor, it may drive the latter into conduction during part of the cycle. During the other half of the cycle it will reinforce the reverse bias which is applied to the transistor base-emitter junction. Under certain conditions, the total applied reverse bias may actually exceed the reverse bias rating of the transistor which may be seriously and permanently damaged. In presently available transistor circuits it is generally impossible to preserve the desired amplitude relationships without the use of elaborate equipment in circuits of this type. Without the use of this equipment the operation of the circuit is either marginal or completely unsatisfactory.

Accordingly, it is the primary object of my invention to provide a bi-directional signal flow circuit which is simple in construction and compact in nature and which permits signal transmission at will in the selected direction, without being subject to cross-talk, feedback, and intermodulation and without subjecting the active elements to damaging potentials. More particularly, it is an object of my invention to provide a circuit of the type described which uses transistors as the active amplifying elements.

In brief, the directional signal switching circuit which comprises the subject matter of this application, provides a pair of signal paths which are connected in parallel between two pairs of terminals, and which are unilaterally conductive in mutually opposite directions. Each signal path includes a transistor and a diode connected in series. A source of bias voltage is provided; the bias voltage applied to the transistor normally maintains it in the non-conductive state. The diodes are biased to render a selected diode conductive while maintaining the other diode in a cut-off state. The biasing potentials are chosen so that the transistor which is connected to the conductive diode in a given signal path, itself becomes conductive. This opens the affected path for signal transmission while the other path remains cut-off.

These and other objects of the invention, together with further features and advantages thereof will become apparent from the following detailed specification when read with the accompanying drawing in which the single figure illustrates a preferred embodiment of the invention.

With reference now to the drawing, a pair of signal paths generally indicated at 10 and 12 are connected in parallel between two pairs of terminals 14 and 16 and permit signal transmission in the direction indicated by the arrow associated with each signal path reference numeral. A pair of input-output transformers 18 and 20 respectively are provided; each of the transformers is coupled between the respective terminals 14 and 16 and the signal paths, as shown in the drawing. One of the terminals 14 or 16 may, of course, be grounded, depending upon the circuits of the signal source and amplifier load.

The signal path 10 contains a junction point 22 which is coupled to the winding 18*a* of the transformer 18 by means of a condenser 24. The signal path 10 further contains an NPN transistor 26 whose collector is connected through the secondary winding 20*a* of the transformer 20 to a collector bias supply 27. A by-pass capacitor 27′ provides an alternating signal ground at the bias supply end of winding 20*a*. A diode 28 is connected between the base of the transistor 26 and the junction point 22 and is poled to transmit normal bias current into the transistor base. A voltage divider formed by resistors 30 and 31 is connected across a source of negative potential 32, one end of the voltage divider and one side of source 31 being grounded. A tap 34 on the voltage divider is capacitively by-passed to ground. A resistor 36 is connected between the tap 34 and the base of the transistor 26 to apply a negative potential to the emitter-base diode. The emitter of the transistor 26 is connected to ground through the biasing resistor 38 which is by-passed by a capacitor 40. One terminal of a resistor 42 is connected to the junction point 22, the other terminal being by-passed to ground through capacitor 43 as well as being connected to one movable contact 44 of a double-pole, double-throw switch generally indicated at 46. A positive potential from a source such as battery 48 is applied to two of the fixed contacts of the switch 46. A negative potential is supplied by the source 50 and appears on the other two fixed terminals of the switch.

The signal path 12 which is substantially identical to the signal path 10 with the exception that it is unilaterally conductive in the opposite direction, contains a junction point 52 which is similar to junction 22 and is coupled to the winding 20a of the transformer 20 by means of a condenser 54, which corresponds to capacitor 24. The resistor 58 connects the junction point 52 to the other movable contact 56 of the switch 46. One of the terminals of resistor 58 is by-passed to ground by condenser 59. The NPN transistor 60 includes a collector which is connected to a bias supply 61 through winding 18a of the transformer 18. A bypass condenser 61' is provided which serves the same purpose as capacitor 27' previously described. A diode 62 is connected between the junction point 52 and the base of the transistor 60 and is poled to conduct in the same direction as the transistor base-emitter diode. The base of the transistor 60 is further connected to the tap 34 of the voltage divider 30 by the resistor 64. The emitter of the transistor 60 is connected to the same terminal of the biasing resistor 38 as the emitter of the transistor 26, i.e., both transistor 26 and transistor 60 use the same emitter biasing circuit.

The tap 34 of the voltage divider 30 is chosen so that the negative potential applied to the bases of the transistors 26 and 60 reverse biases the emitter-base diodes of these transistors and maintains them in a cut-off state. In the position of the switch 46 which is illustrated in the drawing, a negative potential is applied to the junction point 22 and a positive potential is applied to the junction point 52. These potentials which are further applied to one terminal of each diode, are chosen with respect to the potential applied to the base of each transistor from the voltage divider (and hence to the other diode terminal) so that the diode 28 associated with transistor 26 is reverse-biased and the diode 62 is biased in the forward direction. Since the diode 62 is biased in the forward direction its resistance is very small and transistor bias current may flow through it. The values of resistors 58 and 64 are chosen so that the potential between source 48 and that of terminal 34 is divided between them such that the base of transistor 60 is positive, and therefore the base-emitter diode is forward biased, permitting the transistor 60 to respond to applied signals in the conventional manner.

However, the reverse-biased diode 28 prevents any conduction across the base-emitter junction of the transistor 26 and hence no current can flow in its emitter-collector circuit. Not only is signal transmission to the transistor positively prevented so as to preclude any intermodulation of the signal in the signal path 10 or any cross-talk between the paths 10 and 12, but signal leakage currents are also prevented from flowing in the transistor 26. Thus, as long as the diode biasing potentials are applied as shown in the drawing, the signals appearing across the terminals 16 are neither capable of rendering the transistor 26 conductive during one-half of the cycle, nor of exceeding the rated reverse bias of the transistor during the other half cycle. The independent transmission of signals via the signal path 12 is thus accomplished without any side effects which may be harmful to the operation of the circuit. When the switch 46 is thrown to the position other than that illustrated, a positive potential then being applied to the movable contact 44 and a negative potential being applied to the movable contact 56, the signal flow through the signal path 12 is prevented and signal flow permitted through the path 10. A changeover is carried out without causing any harmful side effects. In this case the diode 62 is cut-off, while the diode 28 becomes conductive and enables the transistor 26 to become conductive. Any signals applied across the terminals 14 then appear in amplified form at the terminals 16. Signal transmission in the opposite direction is completely cut-off.

It will be understood that the circuit which forms the subject matter of this invention is not limited to the preferred embodiment which is illustrated in the drawing. For example, PNP junction transistors may be readily employed in place of the NPN transistors which are illustrated, provided the polarity of the diodes as well as of the applied potentials is reversed. The negative potentials applied to the bases of the two transistors need not of course be derived from a voltage divider. It will also be understood that while I have illustrated my invention with respect to a single stage, a number of similar stages might be controlled by a single switch such as switch 46.

In its broader sense, the invention herein provides two signal paths, each path having a pair of unidirectionally conductive devices connected in series with each other, the conductivity of one device being controlled in order to govern the conductivity as well as the operating conditions of the connected device. With this arrangement it is possible to select the direction of signal flow at will while maintaining freedom from intermodulation, cross-talk and leakage problems.

From the foregoing disclosure of the invention, it will become apparent that numerous modifications, departures, and equivalents will now occur to those skilled in the art, all of which fall within the true spirit and scope of this invention.

Having described my invention, what I claim as new and desire to secure by Letters Patent is:

1. A bi-directional signal circuit comprising first and second pairs of terminals, a pair of signal paths connected in parallel between said terminal pairs, each of said paths including a transistor, said transistors being connected to transmit signals in opposite directions, means for biasing each of said transistors below cut-off, each of said signal paths further including a diode connected directly in series with said transistor and polarized to transmit bias current into the transistor with which it is associated, means for selectively applying a pair of bias potentials to said diodes to render one diode conductive and simultaneously biasing the other diode to cut-off, said biasing potential causing one of said diodes to become conductive also biasing the transistor associated therewith for operation as a signal amplifier.

2. A bi-directional signal circuit comprising first and second pairs of terminals, a pair of signal paths connected in parallel between said terminal pairs, each of said paths including a transistor, said transistors being connected to transmit signals in opposite directions, means for biasing each of said transistors to cut-off, each of said signal paths further including a unidirectional element connected directly in series with said transistor said element being connected to transmit bias current into said transistor, means for selectively applying a pair of bias potentials to said unidirectional elements to render one element conductive and simultaneously biasing the other in a direction to render it non-conductive, the potential on the conductive unidirectional element being further adapted to render the transistor connected thereto conductive.

3. A bi-directional signal circuit comprising a pair of unidirectional signal paths connected in parallel between first and second pairs of terminals and adapted to transmit signals in mutually opposite directions, each of said signal paths including a transistor and a diode connected directly in series, a bias voltage supply for maintaining said transistors in a cut-off state, means for selectively rendering one of said diodes conductive and simultaneously cutting off the other diode, said last recited means being further adapted to render the normally cut-off transistor conductive in the signal path which contains said conductive diode.

4. A bi-directional signal circuit comprising a pair of unidirectional signal paths connected in parallel between first and second pairs of terminals and adapted to transmit signals in mutually opposite directions, each of said signal paths including a transistor, a unidirectional element connected directly in series with each of said transistors, means for maintaining said transistors in a cut-off state, means for selectively rendering one of said unidirectional elements conductive and simultaneously cutting off the other unidirectional element, said last recited means being further adapted to render the cut-off transistor conductive in the signal path which contains said conductive unidirectional element.

5. A bi-directional signal circuit comprising a pair of signal paths connected in parallel, each of said signal paths including first and second unidirectionally conductive elements directly connected in series, said elements being poled to render each of said signal paths unidirectional in mutually opposite directions, means for maintaining said first elements in a non-conductive state, means for selectively rendering the second element of one of said signal paths conductive and simultaneously rendering the second element of the other signal path non-conductive, said last recited means being further adapted to render conductive the normally non-conductive first element in the signal path which contains said conductive second element.

6. The combination defined in claim 5 in which said first elements are signal amplifying means.

7. A bi-directional signal circuit comprising first and second terminals, a pair of transistors each having a base, a collector and an emitter, means connecting the collector of a first of said transistors to said first terminal and means connecting the collector of said second transistor to the second of said terminals, a diode directly connected to each of said transistor bases, means connecting the diode connected to said second transistor to said first terminal, and means connecting the diode connected to said first transistor to said second terminal, each of said diodes being poled for bias current transmission into the transistor, means for supplying a bias potential to said transistor emitters, means supplying a negative direct voltage to each of said transistor bases, said negative voltage being adapted to maintain said transistors in the cut-off state, a positive voltage source and a second negative direct voltage source, a first resistor connected to the anode of one of said diodes and a second resistor connected to the anode of a second of said diodes, means for selectively connecting the resistors connected to each of said diodes to respective ones of said positive direct voltage source and said second negative direct voltage source to render one of said diodes conductive and to bias the other diode off, whereby signals may be transmitted between said first and second terminals in only one direction.

References Cited in the file of this patent

UNITED STATES PATENTS

| | | |
|---|---|---|
| 2,021,638 | Ramlau | Nov. 19, 1935 |
| 2,691,073 | Lowman | Oct. 5, 1954 |

FOREIGN PATENTS

| | | |
|---|---|---|
| 1,055,601 | Germany | Apr. 23, 1959 |